(12) United States Patent
Gabriel et al.

(10) Patent No.: US 6,223,968 B1
(45) Date of Patent: *May 1, 2001

(54) SOLDER BONDING/DEBONDING NOZZLE INSERT

(75) Inventors: Charles Felix Gabriel, Vestal; Miguel Angel Jimarez, Newark Valley; Joseph Edward Zdimal, Binghamton, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/481,479

(22) Filed: Jan. 11, 2000

Related U.S. Application Data

(60) Continuation of application No. 09/110,916, filed on Jul. 6, 1998, now Pat. No. 6,082,608, which is a division of application No. 08/716,687, filed on Sep. 16, 1996, now Pat. No. 5,810,241.

(51) Int. Cl.⁷ .................. B23K 1/00; B23K 5/00; B23K 31/00
(52) U.S. Cl. .................. 228/6.2; 228/6.1; 228/49.5; 228/119
(58) Field of Search .................. 228/6.1, 6.2, 49.5, 228/119; 29/743

(56) References Cited

U.S. PATENT DOCUMENTS

| | | | | |
|---|---|---|---|---|
| 4,564,135 | * | 1/1986 | Baressi et al. | 228/6.2 |
| 4,787,548 | * | 11/1988 | Abbagnaro et al. | 228/6.2 |
| 4,844,325 | * | 7/1989 | Nishiguchi et al. | 228/180.2 |
| 4,937,006 | * | 6/1990 | Bickford et al. | 228/219 |
| 5,065,932 | * | 11/1991 | Hayden et al. | 228/55 |
| 5,139,193 | * | 8/1992 | Todd | 228/180.2 |
| 5,419,481 | * | 5/1995 | Lasto et al. | 228/6.2 |
| 5,579,979 | * | 12/1996 | Kurpiela | 228/6.2 |
| 6,082,608 | * | 7/2000 | Gabriel et al. | 228/119 |

* cited by examiner

Primary Examiner—Patrick J. Ryan
Assistant Examiner—L. Edmondson
(74) Attorney, Agent, or Firm—John R. Pivnichny

(57) ABSTRACT

In an apparatus for soldering/desoldering components having a nozzle with larger and smaller ends, the larger end for attaching to an exhaust for drawing a vacuum and to a supply of heated gas for at least softening solder, an insert is attached at the smaller end of the nozzle to adjust the size of that opening for receiving each of a plurality of components, fitting different inserts to different sizes of components.

4 Claims, 1 Drawing Sheet

SOLDER BONDING/DEBONDING NOZZLE INSERT

This is a continuation of Ser. No. 09/110,916 filed Jul. 6, 1998, now U.S. Pat. No. 6,082,608 which is a divisional of Ser. No. 08/716,687 filed Sep. 16, 1996 now U.S. Pat. No. 5,810,241.

1. FIELD OF THE INVENTION

The present invention, generally, relates to a method and apparatus for soldering small components automatically and, more particularly, to a new and improved component handling technique.

Prior U.S. Pat. No. 4,937,006 to Bickford et al. and assigned to the same Assignee as the present invention relates to a structure and method with which this invention is functional. Therefore, the description therein is incorporated by reference into the present description.

BACKGROUND OF THE INVENTION

Equipment and apparatus for handling microelectronic components during assembly, disassembly and rework phases must have an arrangement whereby the extremely small components are grasped for transporting and positioning accurately. In the past, such an arrangement has included a small nozzle-like structure with its larger end formed to fit the equipment or apparatus with which it is being used and its smaller end formed to receive the component to be handled.

In the microelectronic industry, there are dozens of these extremely small components varying in size from several millimeters down to a fraction of one millimeter, each requiring equipment with special tools in order to pick up, transport and position each component. The equipment to move and otherwise handle these extremely small components has been standardized with all adjustments needed to operate.

However, to avoid the necessity of making adjustments to this apparatus every time a different component is to be placed, it has become the standard practice to size the nozzle-like structure end to receive the component within the end surface, so that the apparatus can be adjusted to position the end surface accurately relative to that end. A component of a different size must have its own nozzle-like structure sized to receive it within that end, so it will not project out requiring another adjustment in order to place it accurately.

This practice has worked well for many years, but with the recent increase in technological advances, usage of this equipment has increased also, because of the increased need for building the circuits using smaller and smaller components. Requiring different component-receiving ends for each different component has become almost a nightmare, because of the need to correlate these ends and the components in a practical manner.

2. REVIEW OF THE PRIOR ART

U.S. Pat. No. 4,767,047 to Todd et al. describes a device for grasping a component by suction and heating the solder that holds it in place to soften the solder, whereby the component is removed from a substrate.

U.S. Pat. No. 4,844,325 to Nishiguchi et al. describes apparatus with a collet to grasp a semiconductor chip by the use of a vacuum pump and blowing an inert gas to heat the entire assembly.

U.S. Pat. No. 5,222,655 to Moretti et al. describes apparatus with an open-channeled member for holding an element by a vacuum and a heated gas system to heat the element for soldering.

It is well recognized that soldering involves the application of heat in order to melt the solder so that it adheres to surfaces for creating both electrical and physical connections. It is recognized also in the microelectronics industry particularly that all such applications of heat must be controlled to avoid damage.

OBJECTS AND SUMMARY OF THE INVENTION

It is a principal object of the present invention to provide a method and a device to permit an object to be grasped and retained for moving and positioning accurately in a cost effective manner.

Another object of the present invention is to provide a method and apparatus that avoids previous problems of having to correlate electrical objects with object-handling equipment.

Briefly, the present invention involves forming a nozzle that has a larger end and a smaller end, the larger end being to fit standard, object-handling equipment. The size and configuration of the smaller end is determined to receive a larger object. Forming an insert to be received within the smaller end opening of the nozzle. Forming the insert with an opening to receive a selected object to be handled. By changing inserts, objects of different sizes and configurations are handled readily.

These and other objects, features and advantages of the present invention will become more readily apparent from the following detailed description of the preferred embodiment.

BRIEF DESCRIPTION OF THE DRAWINGS

FIG. 2 is a plan view of the nozzle of FIG. 1.

DETAILED DESCRIPTION OF THE INVENTION

Figure 1:
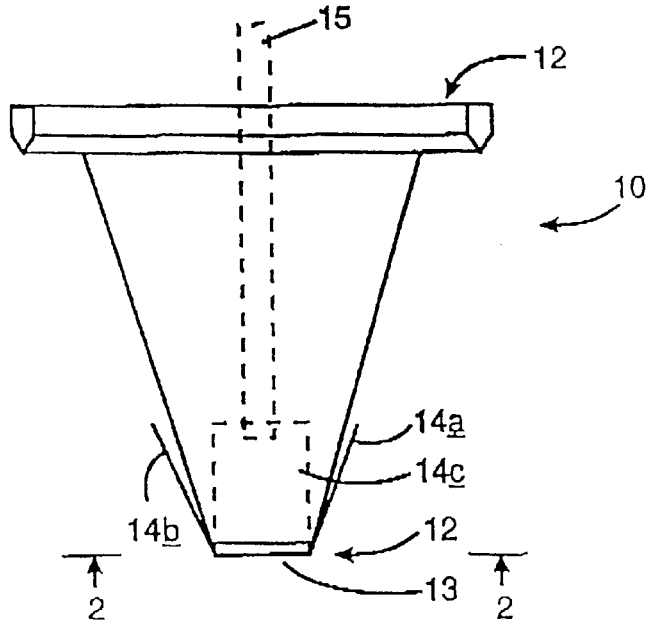
FIG. 1 is a view in elevation illustrating the insert of the present invention in an operative relationship with a nozzle as an aid in describing the invention in more detail.

FIG. 1 of the drawings illustrates significant aspects of the invention, in that the numeral 10 identifies a nozzle having a larger end 11 and a smaller end 12. The larger end 11 is formed to make the nozzle 10 readily attachable to a movable apparatus to position a component relative to a fixed-location, such as to position a chip for soldering to a circuit of a substrate.

The smaller end 12 of the nozzle 10 is larger than the size of a component that is to be handled, but an insert 13 is located over the smaller end 12 to make the opening appropriate for receiving a component. By "appropriate" is meant that such component must fit closely within the opening without binding.

It is the custom in the art to form the nozzle 10 with a small opening for the purpose of receiving a particular component closely without binding, and the component is received completely inside of the nozzle so that the equipment to which the nozzle 10 is attached need be adjusted only once for positioning the small end relative to its final location to deliver the component it carries. However, according to the present invention, it is the insert 13 that determines the opening size, which means that only one size of nozzle 10 is necessary for a range of component sizes.

The insert 13 is formed, according to the present invention, with a number of flaps 14 extending around the border and bent to fit the slope of the nozzle 10. The friction between the flaps 14 against the slope of the nozzle is useful to retain the insert 13 over the opening in the smaller end 12.

A negative pressure is created within the nozzle by a vacuum pump usually connected by means of a pipe 15 to draw and to retain a component within the small end of the nozzle. More details concerning the structure of the insert 13, in accordance with the present invention, will be described presently hereinafter.

FIG. 2 of the drawings shows the nozzle 10 along the line 2—2 in FIG. 1. The flaps 14a and 14b are visible since they are on the outside of the nozzle, and flaps 14c and 14d are illustrated in dotted lines since they are on the inside of the nozzle.

Figure 3:
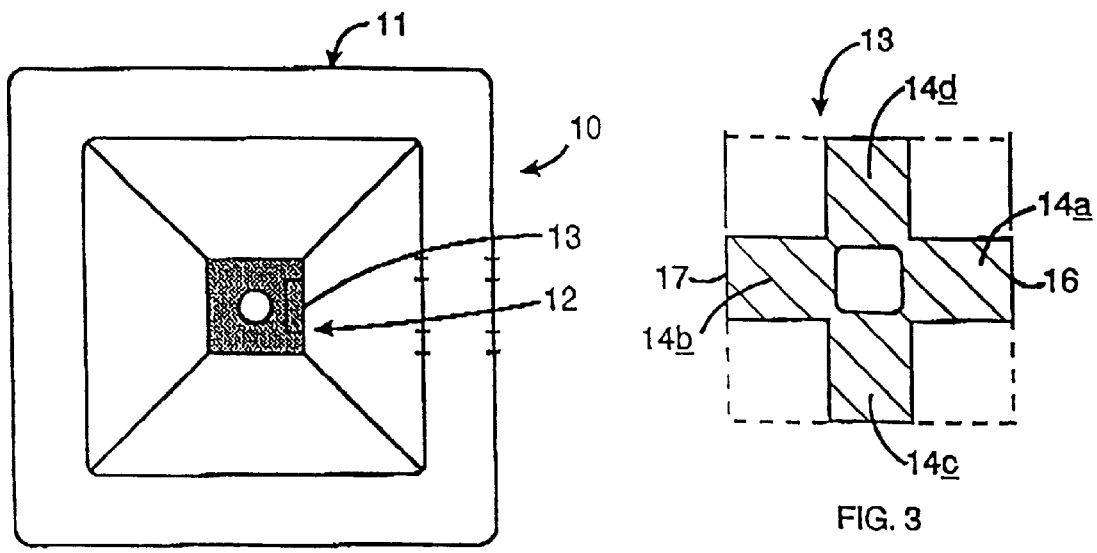
FIG. 3 is a plan view of one step in the process of fabricating an insert in accordance with the present invention.

In accordance with the present invention, the insert 13 is formed from a single sheet, illustrated in FIG. 3 of the drawings, that is approximately 1.500 inches square. This dimension is only approximate because it may vary with different nozzle arrangement with which it is adapted to fit.

The important feature that the insert 13 represents is that the nozzle end 12, seen in FIG. 2, is made with a larger opening than required for the smallest component, and the insert provides a way of obtaining the correct opening size, and shape, for each component to be picked up, transported and positioned correctly and accurately by equipment used for that purpose. Therefore, other and different ways may be provided by those skilled in this art for making this larger opening in a nozzle smaller as required for different sizes of components.

In FIG. 3, the four flaps are illustrated, and the opposite flaps 14a and 14b are identified more clearly, as are the opposite flaps 14c and 14d. While the length of the flaps 14 may vary and can be formed in accordance with various needs, it is found that a length of 1.5 inches from one edge 16 on the flap 14a to the edge 17 on the flap 14b is entirely satisfactory.

As described, supra, a central opening is formed in accordance with the dimensions of a particular component to be handled, such as a particular flip chip to be removed from a soldered position on a substrate and transported to a different location for reworking With the insert 10 of the invention, only the insert 13 is needed.

Figure 4:
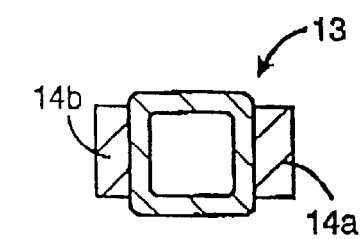
FIG. 4 is a plan view of the insert fabricated according to the present invention with portions folded, as will be described in more detail hereinafter.

FIG. 4 of the drawings illustrates a view of the insert 13 alone as it is seen from the line 2—2 in FIG. 1. That is, the two flaps 14a and 14b are extended over the outside surface of the nozzle while the two flaps 14c and 14d are on the inside of the nozzle and not visible.

Figure 5:
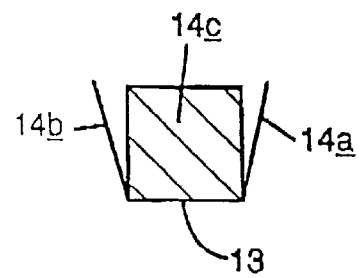
FIG. 5 is a view in elevation of the insert alone with portions folded as a further aid in the following description.

FIG. 5 is a view of the insert 13 alone with the flaps 14a, 14b and 14c being visible, and a view of the flap 14d is blocked by the flap 14c.

While the invention has been described in substantial detail with what is presently considered to be the most practical and the presently preferred embodiment, it is to be understood that the invention is not limited by the embodiment described, but rather, the invention is intended to include various modifications and the equivalent arrangements that are covered by the spirit and scope of the appended claims. Therefore, anyone skilled in this field should understand that all such alterations and changes are included within the scope of the following claims.

What is claimed is:

1. An apparatus comprising:

means for grasping and holding for positioning a component and a solder-wettable surface in contiguous relationship relative to each other;

said means including means to create a vacuum, and means to develop a supply of gas heated to a temperature sufficient to at least soften solder material;

the improvement comprising:

said means for grasping and holding for positioning including hollow means with a larger end and a smaller end relative to each other;

replaceable separate insert means adapted to fit said smaller end and having an opening sized to receive said component in said contiguous relationship with said solder-wettable surface; and wherein said gas is selected from the group consisting of an oxidizing gas, a reducing gas and a nonreactive gas.

2. The apparatus of claim 1, wherein said solder-wettable surface is selected from the group consisting of gold, palladium, and platinum.

3. The apparatus of claim 1, wherein said component is a flip chip.

4. The apparatus of claim 1, wherein said component has solder mounds.

* * * * *